United States Patent [19]

Brosh et al.

[11] Patent Number: 4,987,389
[45] Date of Patent: Jan. 22, 1991

[54] LOCKPROOF LOW LEVEL OSCILLATOR USING DIGITAL COMPONENTS

[75] Inventors: Amnon Brosh, Montvale; Wolf S. Landmann, Fair Lawn, both of N.J.

[73] Assignee: Borg-Warner Automotive, Inc., Sterling Heights, Mich.

[21] Appl. No.: 503,395

[22] Filed: Apr. 2, 1990

[51] Int. Cl.$^5$ .................. H03B 5/08; G08C 19/12; G08C 21/00
[52] U.S. Cl. ......................... 331/167; 331/65; 331/117 FE; 331/181; 331/DIG. 3; 324/236
[58] Field of Search .............. 331/57, 65, 66, 117 FE, 331/117 R, 117 D, 167, 181, DIG. 3; 324/327, 236, 57 Q, 59; 340/941

[56] References Cited

U.S. PATENT DOCUMENTS

| | | | |
|---|---|---|---|
| 3,551,649 | 12/1970 | Weber | 235/92 |
| 3,742,487 | 6/1973 | Tripp | 341/117 |
| 3,745,475 | 7/1973 | Turner | 328/134 |
| 3,747,083 | 7/1973 | Coia | 340/870.05 |
| 4,016,558 | 4/1977 | Bishop et al. | 341/127 |
| 4,053,849 | 10/1977 | Bower et al. | 331/65 |
| 4,136,335 | 1/1979 | Tompsett | 341/172 |
| 4,150,573 | 4/1979 | Iinuma et al. | 374/185 |
| 4,201,911 | 5/1980 | Dering | 250/231.17 |
| 4,284,961 | 8/1981 | Landau | 331/181 X |
| 4,349,746 | 9/1982 | Grossner et al. | 307/106 |
| 4,389,637 | 6/1983 | Rzeszewski | 341/152 |
| 4,503,922 | 3/1985 | Brosh et al. | 177/210 EM |
| 4,583,856 | 4/1986 | Moore | 356/358 |
| 4,613,829 | 9/1986 | Ott | 331/167 X |
| 4,637,265 | 1/1987 | Fiori, Jr. | 73/862.33 |
| 4,644,570 | 2/1987 | Brosh et al. | 377/17 |
| 4,663,589 | 5/1987 | Fiori, Jr. | 324/207.16 |
| 4,709,224 | 11/1987 | Fiori, Jr. | 341/152 |
| 4,777,436 | 10/1988 | Fiori, Jr. | 324/207.17 |
| 4,804,960 | 2/1989 | Fernandes et al. | 341/158 |
| 4,807,264 | 2/1989 | Bauer | 377/24.1 |
| 4,816,704 | 3/1989 | Fiori, Jr. | 307/519 |
| 4,833,919 | 5/1989 | Saito et al. | 73/313 |
| 4,841,245 | 6/1989 | Fiori, Jr. | 324/207.17 |
| 4,851,770 | 7/1989 | Fiori, Jr. | 324/207.16 |

OTHER PUBLICATIONS

"A 16-Bit A-D-A Conversion System for High-Fidelity Audio Research," *IEEE Transactions on Acoustics, Speech, and Signal Processing*, vol. ASSP-23, No. 1, Feb. 1975.

*Primary Examiner*—David Mis
*Attorney, Agent, or Firm*—Gregory A. Stobbs; Greg Dziegielewski

[57] ABSTRACT

Three series connected inverters (38, 40, 42) are attached to a tank circuit (18) which includes an inductance (12, 14) and a capacitance (16, 17). Negative (38) biases the inverters at the midpoint between the bistable low and high logic level states. Positive feedback from the second inverter (40) to the tank circuit induces oscillation in the tank circuit. The negative feedback is decoupled at the resonant frequency and the energy delivered to the tank circuit from the positive feedback maintains a low level oscillation in the tank circuit. Negative feedback around the three inverter digital circuit prevents lockup in the event of power loss or momentary short.

22 Claims, 1 Drawing Sheet

LOCKPROOF LOW LEVEL OSCILLATOR USING DIGITAL COMPONENTS

BACKGROUND AND SUMMARY OF THE INVENTION

The present invention relates generally to oscillator circuits. More particularly the invention relates to a lockproof digital circuit employing low cost digital inverters suitable for integrated circuit mass production. The circuit produces a logic level oscillation at a frequency dictated by an associated tank circuit. The signal excursions in the tank circuit can be maintained at a substantially low energy level notwithstanding the comparatively high energy level of the signal output. This greatly minimizes crosstalk and interference.

Resonant circuits are commonly used to measure physical parameters. For example, there is a class of displacement sensors which employs an inductance tank circuit with moving vane tuning plate to measure position. Our prior U.S. Pat. No. 4,644,570, entitled "Sensor Amplification and Enhancement Apparatus Using Digital Techniques," issued Feb. 17, 1987, describes such a displacement sensor. The position of the tuning plate alters the inductance of the coil and thus alters the resonant frequency of the tank circuit. By energizing the tank circuit and measuring the frequency of the resonant oscillations produced, position of the tuning plate can be inferred.

With the advent of digital technology, it has become desirable to use digital components in an oscillator circuit, since digital circuits can be made small and inexpensive and are easily implemented in integrated circuit (IC) packages. However, conventional digital circuits in such applications exhibit lockup in which the digital components assume conflicting states which prevent oscillation. This can be caused by signal transients and dropouts and represents a serious shortcoming of conventional designs.

Digital shaper circuits and hybrid analog/digital circuits have also been experimented with but difficulties in addition to lockup have been encountered. For instance, in switched circuit applications or in applications where electromagnetic radiation from the inductor interferes with other circuitry, these circuits pose problems due to the relatively high energy levels at which these circuits operate.

In a switched application, for example, it may be necessary to abruptly change the current applied to the inductor. Abrupt changes in current cause high energy voltage spikes which can cause radio frequency interference and which can induce errors in associated digital circuitry. Even in unswitched applications, high energy level oscillations in the tank circuit can cross-couple with and radiate to other parts of the circuit, causing unwanted crosstalk and interference.

The present invention overcomes the above limitations of conventional high level oscillator circuits by providing a fully digital lockproof circuit in which the signal amplitude in the tank circuit can be adjusted and kept at a low level. The oscillator circuit of the invention comprises a digital circuit employing first, second and third inverters connected in series. The three inverter digital circuit is operable between bistable high and low logic level states. A tank circuit comprising a capacitance and an inductance is coupled to the input of the first inverter to establish a resonant frequency. A negative feedback circuit connects the output of the third inverter with the input of the first inverter. The negative feedback circuit biases the digital circuit to an intermediate point between the high and low bistable states. The negative feedback circuit may include a frequency selective circuit for decoupling the negative feedback at the resonant frequency.

The circuit further includes a positive feedback circuit coupled between the output of the second inverter and the tank circuit. The positive feedback circuit delivers energy to the tank circuit, thereby inducing oscillation in the tank circuit at the resonant frequency. The output of the third inverter is a logic level signal which oscillates between the high and low bistable states in synchronism with the induced oscillation in the tank circuit. The positive feedback includes an impedance for restricting the amount of energy delivered to the tank circuit, thereby reducing the amplitude of the oscillations in the tank circuit, without reducing the signal amplitude at the output of the third inverter This has the advantage of greatly reducing the signal level in the inductance and thereby greatly reducing cross talk and interference problems.

For a more complete understanding of the invention, its objects and advantages, reference may be had to the following specification and to the accompanying drawings.

DESCRIPTION OF THE PREFERRED EMBODIMENT

The low level oscillator of the invention has many uses. As an example, the oscillator will be shown in a displacement sensor application in which a pair of complementary coils are alternately connected to a tank circuit and energized. The resonant frequency of the tank circuit is measured after each coil is energized to determine each coil's inductance. Physical displacement of a tuning plate or tuning slug in proximity to the coils changes the coil's inductance, thereby establishing a relationship between position and inductance (or resonant frequency). The circuit may, for example, also be used to measure the inductance of a coil under test.

Figure 1:
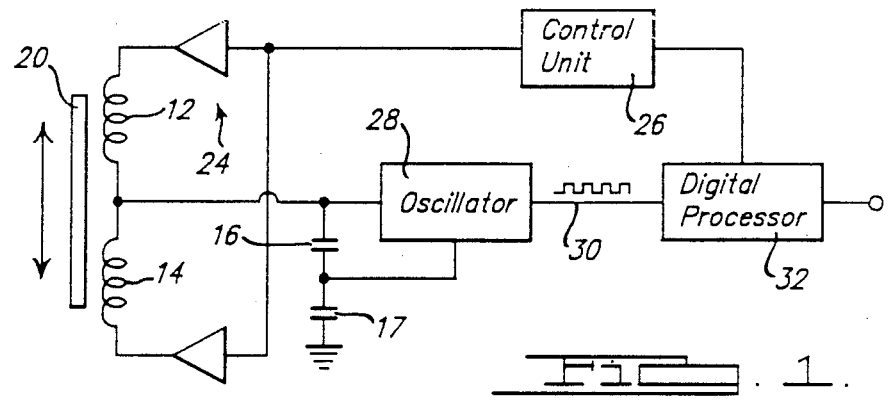
FIG. 1 is a block diagram illustrating one possible use of the low level oscillator.

Accordingly, FIG. 1 illustrates an exemplary view of a displacement sensing apparatus illustrated generally at 10. A pair of inductances 12 and 14, together with capacitances 16 and 17 form a resonant tank circuit 18. The inductances may be complementary coils, such as described in our earlier patent cited above. A movable tuning plate 20 is positioned in proximity to the inductances 12 and 14, causing the respective inductances to change in a complementary way. As illustrated, both inductances are connected to capacitance 16 at node 22.

Connected to each inductance is a multiplexing circuit 24 which, in response to external control of a control circuit 26, selectively grounds one of the two inductances. When grounded, the selected inductance becomes part of a complete tank circuit. If desired, only one inductance is selected at a time, thus when inductance 12 is coupled into the tank circuit, inductance 14 is idle and may be ignored.

The oscillator circuit 28 of the invention is connected to the tank circuit 18, causing the tank circuit to oscillate at the resonant frequency. The oscillator circuit 28 includes an output port 30 on which the digital output waveform is supplied. The digital output waveform is a square wave or fast rise time, non-sinusoidal pulsed oscillation between two bistable states. The output oscillates between 0 volts and 5 volts, making it well-suited for connection to conventional digital logic circuitry. The output waveform oscillates in synchronism with the tank circuit oscillation and at the same frequency. If desired, a digital processing circuit 32 may be connected to output port 30 to produce a digital number corresponding to the oscillator frequency. From there, the digital number can be used in a variety of different ways, depending on the circuit requirements.

In the exemplary application illustrated, two inductances are shown. This is a common practical example, since many position sensors use complementary coils to offset temperature variation and component drift errors. As stated above, the low level oscillator is useful in a wide variety of different applications, and is not restricted to the complementary coil position sensor illustrated.

Figure 2:
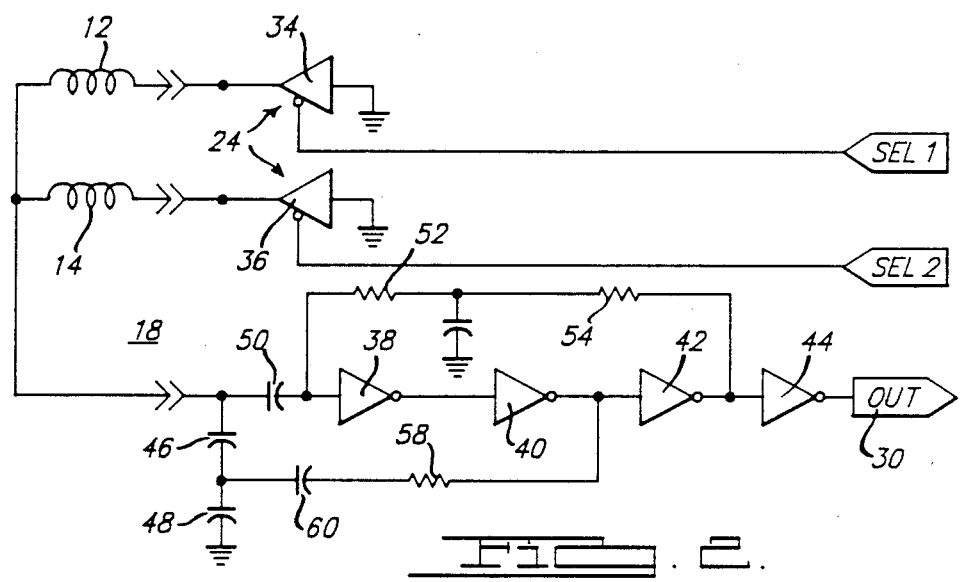
FIG. 2 is a schematic diagram of the low level oscillator of the invention.

Referring to FIG. 2, the presently preferred low level oscillator is illustrated in combination with a pair of inductances 12 and 14. Also illustrated is multiplexing circuit 24, which has been implemented using a pair of tristate buffers 34 and 36. The tristate buffers are enabled by the control circuit 26 on leads SEL1 and SEL2. When enabled, each tristate buffer connects the associated inductance to ground. When disabled, the tristate buffer acts as an open circuit. In other words, the tristate buffers function as switches, connecting the associated inductance to ground when enabled. 74HC367 integrated circuits may be used for the tristate buffers.

At the heart of the oscillator circuit are the series connected first inverter 38, second inverter 40 and third inverter 42. As illustrated, the output of inverter 38 is connected to the input of inverter 40 and the output of inverter 40 is connected to the input of inverter 42. Together these inverters comprise a digital circuit which supplies energy to tank circuit 18 and which also produces an output waveform of logic level pulses at a frequency dictated by the frequency of the oscillations within the tank circuit. The inverters may be 74HC04 integrated circuits. Typically inverters of this type are packaged in multiple sets on a single chip. If desired, an additional inverter can be connected as a fourth inverter 44, serving as an optional buffer supplying output port 30.

The tank circuit 18 is made up of a pair of series connected capacitors 46 and 48 and a selected one of the inductances 12 and 14. Tank circuit 18 is capacitively coupled through capacitor 50 to the input of first inverter 38. A negative feedback circuit comprising resistors 52 and 54 and capacitor 56, connects the output of third inverter 42 to the input of first inverter 38. The resistance values of resistors 52 and 54 are not critical and may be appropriately selected generally lower than the input impedance of the inverters. Capacitor 56 is appropriately selected to decouple the negative feedback at or ,near the resonant frequency of the tank circuit. Accordingly, capacitor 56 is connected between the negative feedback resistors 52 and 54 and ground. This capacitor serves as a frequency selective means for decoupling the negative feedback at the resonant frequency, by shorting it to ground.

Figure 3:
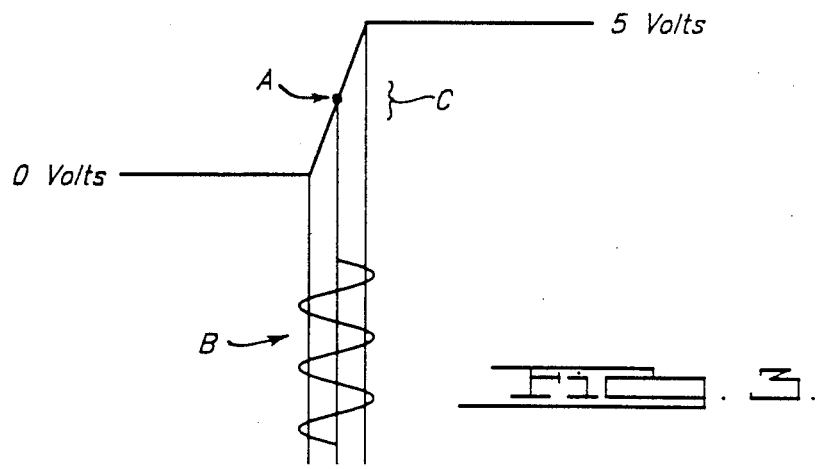
FIG. 3 is a graph illustrating the biasing and operation of the digital inverter circuit.

The purpose of the negative feedback circuit is to bias the digital circuit comprising inverters 38, 40 and 42 to an intermediate operating point between the respective high and low bistable states. Referring to FIG. 3, each inverter is capable of selectively assuming two bistable states, a low state of approximately 0 volts and a high state of approximately 5 volts. The transition between low and high states is quite rapid. Using CMOS devices, the typical inverter remains at the low state for input voltages lower than about 2.4 volts and assumes the high state for input voltages at or above 2.6 volts. In practice, the transition between low state and high state may occur somewhere between 2.49 and 2.51 volts. While the precise transition point can be expected to vary from device to device, the negative feedback biasing guarantees that the transition always takes place as a result of small input changes.

The negative feedback circuit collectively biases inverters 38, 40 and 42 to the intermediate point or midpoint between the high and low bistable states. If the output of inverter 42 rises or falls, the negative feedback circuit applies compensation to the input of inverter 38, causing the output of inverter 42 to remain at the midpoint. Absent an external input from the tank circuit, the digital circuit comprising inverters 38, 40 and 42 will thus remain at the intermediate point between the high and low bistable states. This intermediate point is illustrated generally at A in FIG. 3.

The oscillator circuit further comprises a positive feedback circuit comprising resistor 58 and capacitor 60. The positive feedback is taken from the output of inverter 40 and is fed to the connection point between capacitors 46 and 48. Positive feedback from the output of inverter 40 provides energy to tank circuit 18, tending to cause analog oscillations in the tank circuit. Because the tank circuit is coupled through capacitor 50 to the input of inverter 38, the inverters will follow the oscillations of the tank circuit, producing a square wave output at the output of inverter 42 (and likewise inverter 44) which toggles in synchronism with the tank circuit oscillation and at the resonant frequency of the tank circuit oscillation.

Referring again to FIG. 3, the oscillation of the tank circuit is shown generally at B along the vertical axis aligned with the intermediate point A. As FIG. 3 illustrates, oscillations in the tank circuit cause the inverters to toggle between the low and high bistable states whenever the tank circuit signal amplitude crosses the threshold at which switching occurs. In FIG. 3, the threshold is shown generally by the brace designated C.

The nature of the digital inverters is such that tank circuit oscillations as small as 1 millivolt peak to peak can be used to trigger full scale state changes in the inverters. In other words, the analog oscillations within the tank circuit inductance can be quite small (1 millivolt) in comparison to the output signal (5 volts). At such low levels, many of the troublesome characteristics associated with inductance switching and with electromagnetic coupling are so greatly attenuated that they can be largely ignored.

In practice, the signal level of oscillations within the tank circuit is controlled by controlling the amount of positive feedback energy supplied via capacitor 60. In the presently preferred embodiment capacitor 60 is on the order of 10 to 100 times smaller than capacitors 46 and 48, which may be equal in value. Ratios of up to 1,000 may be used. This means that very little positive feedback energy is delivered to the tank circuit and thus a very low level oscillation is established therein. This is possible because of the extremely steep transition between states which the digital inverters exhibit. Negative feedback causes the inverters to operate under quiescent conditions at the optimum trigger point at which even a very slight oscillation of the tank circuit will cause the inverters to change state, oscillating between the fully on and fully off bistable states. Decoupling of the negative feedback through capacitor 56 at the resonant frequency allows the circuit to oscillate with only a slight positive feedback.

The oscillator circuit is constructed to insure that it will not go into a locking mode when the tank circuit fails to oscillate. This is established by the combination of positive and negative feedback in the three inverter oscillator circuits The dual feedback in the three inverters and tank combination does not allow the oscillator to look in the logic low or logic high state. Without the positive/negative feedback combination, a lockup could occur wherein the inverters assume that same logical state and cannot thereafter be set into oscillation.

It is seen that the low level oscillator circuit of the invention employs digital components, such as gates, exclusively in conjunction with a tank circuit to provide a pulse output having a repetition rate which is a function of the tank circuit resonant frequency. The circuit is able to provide a logic level output while the amplitude of the oscillations in the tank circuit are kept at a low level to reduce RF emissions and cross-coupling interference. The circuit is well designed to prevent lockup of the oscillator even under adverse conditions such as a temporary shorting or power loss.

While the invention has been described in a presently preferred embodiment, certain modifications may be made without departing from the spirit of the invention as set forth in the appended claims.

What is claimed is:

1. An lockproof oscillator circuit comprising:
   digital circuit means comprising first, second and third inverters coupled in series and each having an input and an output, the output of said first inverter coupled to the input of said second inverter and the output of said second inverter coupled to the input of said third inverter;
   said digital circuit being operable between bistable high and low states;
   a tank circuit comprising capacitance means and an inductance means coupled together to establish a resonant frequency and further coupled to the input of said first inverter;
   negative feedback means coupled between the output of said third inverter and the input of said first inverter for biasing said digital circuit at an intermediate point between said high and low states;
   positive feedback means coupled between the output of said second inverter and said tank circuit for delivering energy to said tank circuit and thereby inducing oscillation in said tank circuit at said resonant frequency;
   said third inverter producing at the output a signal which oscillates between said high and low states in synchronism with the induced oscillation in said tank circuit;
   said positive feedback means including impedance means for restricting the amount of energy delivered to said tank circuit and thereby reducing the amplitude of said oscillations in said tank circuit without reducing the signal amplitude at the output of said third inverter.

2. The circuit of claim 1 further comprising frequency selective means associated with said negative feedback means for decoupling said negative feedback means at said resonant frequency.

3. The circuit of claim 1 wherein said capacitance means comprises series connected capacitors joined at a common node and said positive feedback means is coupled to said common node.

4. The circuit of claim 1 wherein said impedance means includes a capacitor.

5. The circuit of claim wherein said impedance means includes a capacitor of substantially greater capacitance than said capacitance means of said tank circuit.

6. The circuit of claim 5 wherein said capacitor is on the order of 1,000 times the capacitance of said capacitance means.

7. The circuit of claim 2 wherein said frequency selective means comprises low pass filter means.

8. The circuit of claim 1 further comprising multiplexing means for selectively coupling said inductance means in said tank circuit.

9. The circuit of claim 1 further comprising second inductance means and multiplexing means for selectively coupling said inductance means and said second inductance means in said tank circuit.

10. The circuit of claim 1 further comprising buffer means coupled to the output of said third inverter.

11. A circuit for measuring inductance of an inductor under test comprising:
   digital circuit means comprising first, second and third inverters coupled in series and each having an input and an output, the output of said first inverter coupled to the input of said second inverter and the output of said second inverter coupled to the input of said third inverter;
   said digital circuit being operable between bistable high and low states;
   a tank circuit comprising a capacitance means and said inductor under test coupled together to establish a resonant frequency and further coupled to the input of said first inverter;
   negative feedback means coupled between the output of said third inverter and the input of said first inverter for biasing said digital circuit at an intermediate point between said high and low states;
   positive feedback means coupled between the output of said second inverter and said tank circuit for delivering energy to said tank circuit and thereby inducing oscillation in said tank circuit at said resonant frequency;
   said third inverter producing at the output a signal which oscillates between said high and low states in synchronism with the induced oscillation in said tank circuit;
   said positive feedback means including impedance means for restricting the amount of energy delivered to said tank circuit and thereby reducing the amplitude of said oscillations in said tank circuit without reducing the signal amplitude at the output of said third inverter;
   means for detecting the frequency of said signal at the output of said third inverter to thereby determine the inductance of said inductor under test.

12. The circuit of claim 11 further comprising frequency selective means associated with said negative feedback means for decoupling said negative feedback means at said resonant frequency.

13. The circuit of claim 11 wherein said means for detecting the frequency comprises a digital circuit.

14. The circuit of claim 11 wherein said capacitance means comprises series connected capacitors joined at a common node and said positive feedback means is coupled to said common node.

15. The circuit of claim 11 wherein said impedance means includes a capacitor.

16. The circuit of claim 11 wherein said impedance means includes a capacitor of substantially greater capacitance than said capacitance means of said tank circuit.

17. The circuit of claim 16 wherein said capacitor is on the order of 20 to 1,000 times the capacitance of said capacitance means.

18. The circuit of claim 12 wherein said frequency selective means comprises low pass filter means.

19. The circuit of claim 11 further comprising multiplexing means for selectively coupling said inductor under test in said tank circuit.

20. The circuit of claim 11 further comprising second inductor under test and multiplexing means for selectively coupling said inductor and said second inductor under test in said tank circuit.

21. The circuit of claim 11 further comprising buffer means coupled to the output of said third inverter.

22. A multiplexed oscillator circuit comprising:
digital circuit means comprising first, second and third inverters coupled in series and each having an input and an output, the output of said first inverter coupled to the input of said second inverter and the output of said second inverter coupled to the input of said third inverter;
said digital circuit being operable between bistable high and low states;
a first tank circuit comprising a capacitance means and an inductance means coupled together to establish a resonant frequency;
a second tank circuit comprising a capacitance means and an inductance means coupled together to establish a resonant frequency;
multiplexing means for selectively coupling either said first tank circuit or said second tank circuit to the input of said first inverter;
negative feedback means coupled between the output of said third inverter and the input of said first inverter for biasing said digital circuit at an intermediate point between said high and low states;
positive feedback means coupled to the output of said second inverter and further coupled to selectively deliver energy to said first and second tank circuits, thereby selectively inducing oscillation in said tank circuits at said resonant frequencies;
said third inverter producing at the output at signal which oscillates between said high and low states in synchronism with the induced oscillation in at least one of said tank circuits;
said positive feedback means including impedance means for restricting the amount of energy delivered to said tank circuits and thereby reducing the amplitude of said oscillations in said tank circuits without reducing the signal amplitude at the output of said third inverter.

* * * * *

UNITED STATES PATENT AND TRADEMARK OFFICE
CERTIFICATE OF CORRECTION

PATENT NO. : 4,987,389

DATED : January 22, 1991

INVENTOR(S) : Amnon Brosh et al.

It is certified that error appears in the above-identified patent and that said Letters Patent is hereby corrected as shown below:

On the title page, Abstract:
   Item: [57], line 3, after "negative" insert -- feedback from the third inverter 42 to the first inverter --.

Column 5, line 40, Claim 1, delete "An" and insert -- A --.

Column 8, line 23, Claim 22, delete "at" second occurrence and insert -- a --.

Signed and Sealed this

Twenty-first Day of September, 1993

Attest:

BRUCE LEHMAN

Attesting Officer   Commissioner of Patents and Trademarks